May 19, 1970 L. E. HAYDEN ET AL 3,512,255

FLAT-PACK CIRCUIT MODULES PACKAGING

Filed Dec. 29, 1967

2 Sheets-Sheet 1

WITNESSES

Theodore F. Wrobel

James F. Young

INVENTORS
Leland E. Hayden
and Cornelius D. Flynn

BY D. J. Straetoff

AGENT

United States Patent Office 3,512,255

Patented May 19, 1970

3,512,255
FLAT-PACK CIRCUIT MODULES PACKAGING

Leland E. Hayden, Elkridge, and Cornelius D. Flynn, Catonsville, Md., assignors to Westinghouse Electric Corporation, Pittsburgh, Pa., a corporation of Pennsylvania Filed Dec. 29, 1967, Ser. No. 694,734
Int. Cl. H01b 13/00; H05k 3/00
U.S. Cl. 29—624 3 Claims

ABSTRACT OF THE DISCLOSURE

Assembly of flat-pack microcircuit modules having their edge leads in parallel rows as arranged by an open-slotted assembling fixture, and in extension through tapered holes in thin flat elongated mounting members as guided onto such leads by the assembling fixture. By wave soldering, printed circuits on outer faces of the mounting members are joined to the flat-pack leads, to interconnection pins extending between members from one printed circuit to the other, and to input/output pins projecting outwardly from one printed circuit face beyond a potting compound which otherwise encapsulates the entirety of the assembly.

BACKGROUND OF THE INVENTION

Field of the invention

Plug-in assembly of flat-pack microcircuit modules.

Description of the prior art

With the advent of use of compact plug-in assemblies of microcircuit modules of flat-pack configuration, it becomes increasingly more important to provide assemblies of this type which facilitate electrical connection of module leads to one another and to input/output pins.

SUMMARY

In accord with features of the present invention, the desired number of flat-pack microcircuit modules are in parallel array with their leads extending in parallel rows through tapered-end holes in oppositely-arranged mounting members, and introduction of such leads into the members is facilitated by employment of an assembling fixture which accepts such modules with ease and prepositions them in such parallel array with their aggregate leads in precise positioning for simultaneous introduction to a respective mounting member on a given lead side. The tapered ends of the lead-accommodating holes in the mounting members are on the inner faces of such members to enable such simultaneous introduction of leads without difficulty in the presence of minute differences in alignment of the projecting ends of such leads. The flat-pack leads extending through the mounting members are soldered to printed circuit conductors formed on the outer surfaces of the mounting members, and all leads on a given side can be soldered simultaneously by such as the well-known wave soldering technique. Interconnection between certain printed circuit conductors on the two mounting members and to input/output pins projecting from one of such members is provided by shouldered pins which are dimensioned to be inserted to a limited degree into pin-accommodating holes arranged in rows between the module-lead-accommodating holes in the mounting members, which pins can be soldered to such conductors simultaneously with the flat-pack lead ends by protecting the projecting input/output pin ends from becoming solder coated by a preceding application of a removable solder resist, as when wave soldering is employed. And finally, by encapsulation of the assembly including the printed circuit surfaces of the mounting members save for the projecting input/output pins, a rugged, dependable, compact, plug-in assemblage of flat-pack microcircuit modules is provided.

DESCRIPTION OF THE PREFERRED EMBODIMENT

Figures 1, 2:
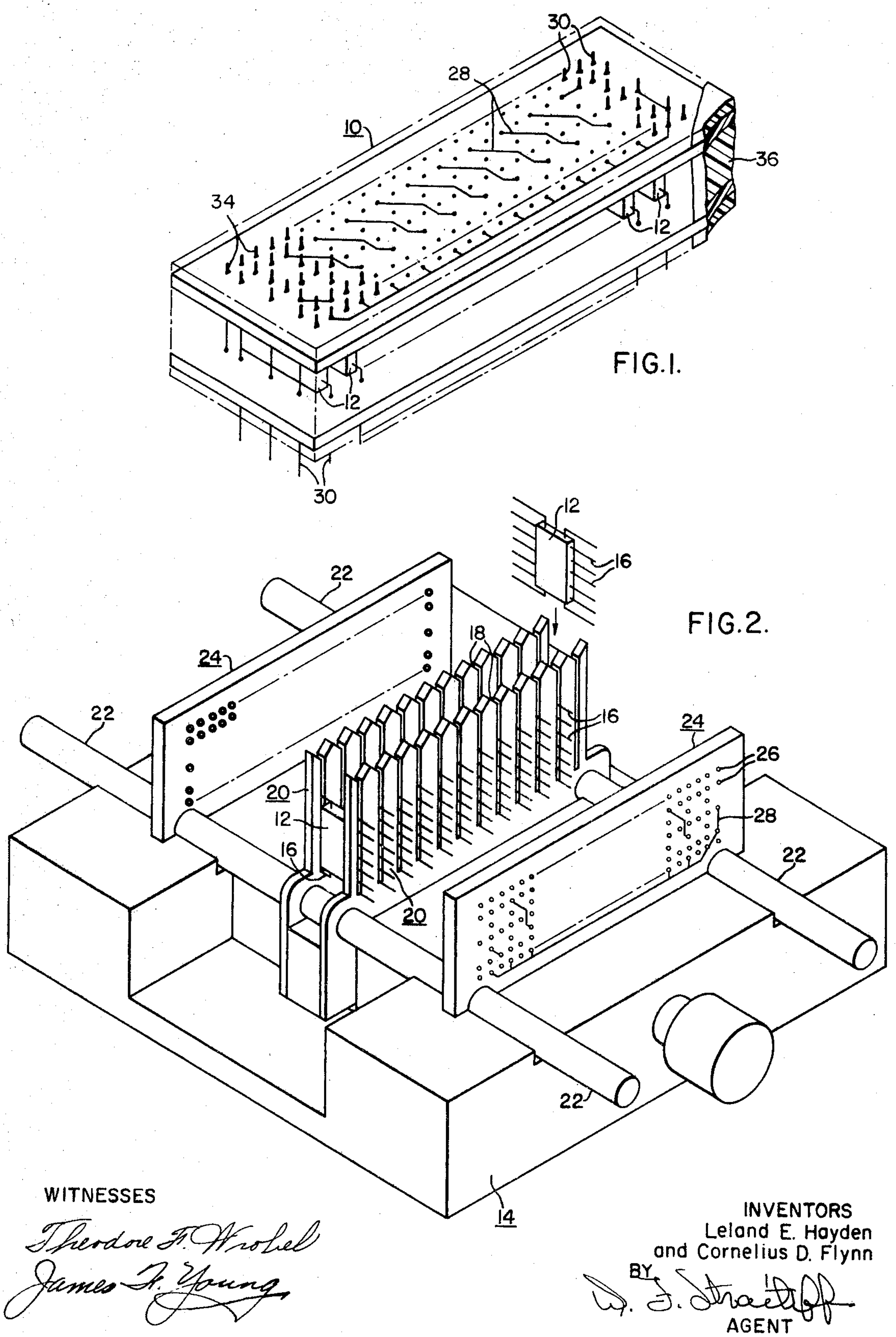
FIG. 1 is a perspective view of the plug-in assemblage of flat-pack microcircuit modules constructed in accord with the present invention.
FIGS. 2 and 3 illustrate different stages of assembly of the assemblage of FIG. 1, together with an assembling fixture employed in several such stages.

Referring to FIG. 2, according to features of the present invention, fabrication of a compact plug-in assemblage 10 of flat-pack microcircuit modules 12 is facilitated by employment of an assembling fixture 14 adapted to receive the flat-pack modules 12 of the assemblage with ease by the mere edgewise sliding insertion of their parallel multiple leads 16 downwardly into respective fixture slots 18 which results in parallel spaced-apart alignment of such modules 12 with their leads extending horizontally at opposite edges in parallel vertical rows 20 precisely spaced apart. The bottom edges of the fixture slots 18 define horizontally aligned positions for the lead rows 20 a prescribed distance above parallel horizontal guide rails 22. Following insertion of the required number of flat-pack modules 12 into the assembling fixture 14, two flat, thin rectangular mounting members 24 with through-holes 26 tapered on an inner face of such members 24 and intersecting printed circuit leads 28 on the outer face are fit at one edge onto the horizontal assembling-fixture guide rails 22 and slid toward the projecting flat-pack lead ends 16 to bring same into insertion through the tapered ends of certain of the through holes 26 in such members. The assemblage of parallel flat packs 12 with their leads extending horizontally through holes 26 in the parallel printed circuit members 24 is then removed from the assembling fixture 14 by upward movement of such members to slide the flat-pack leads 16 out of the fixture slots 18.

Figure 3:
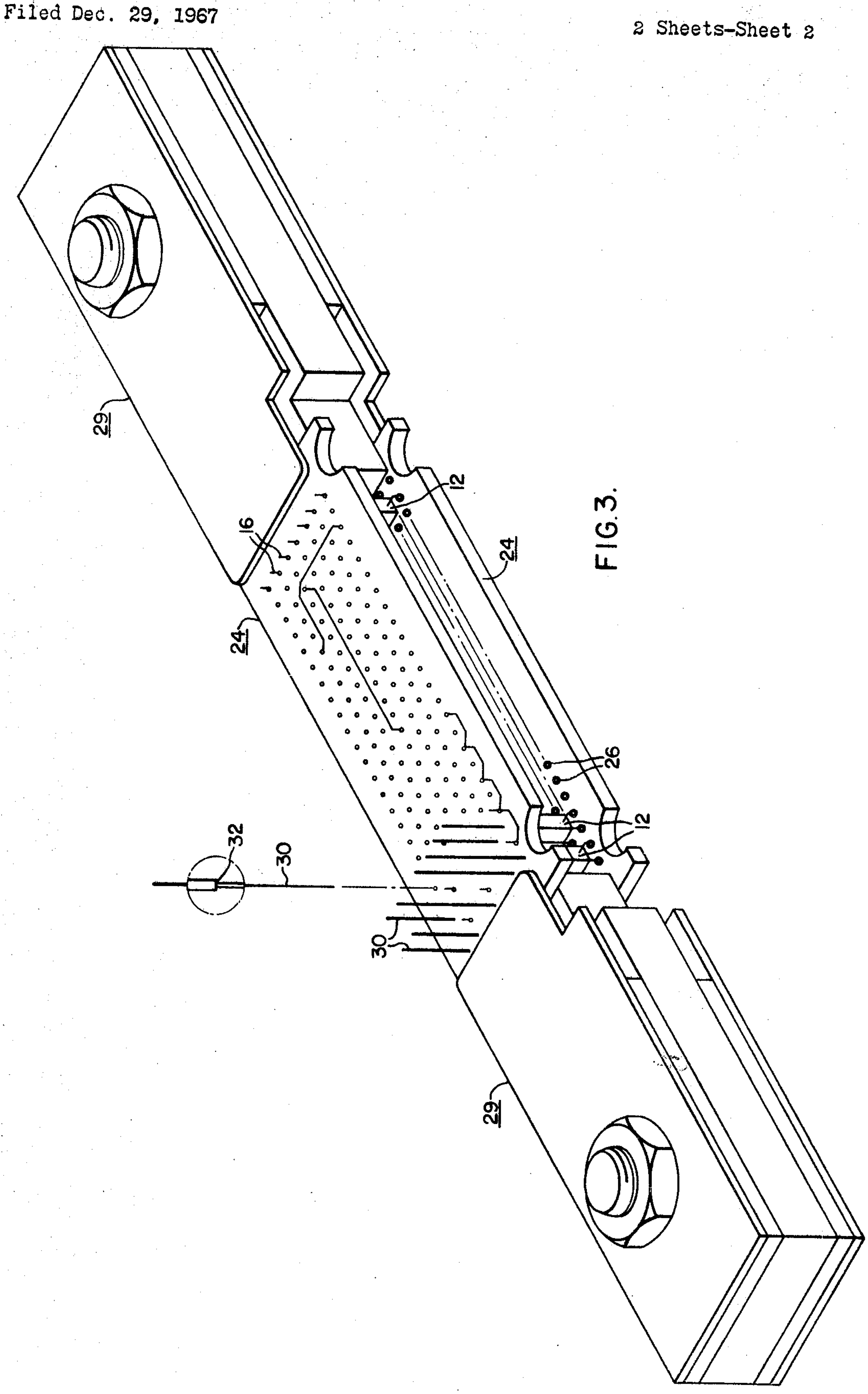

The printed circuit members 24 are then clamped by clamping members 29 at opposite ends to precisely define a separation distance therebetween and placed with one of such members disposed horizontally and on top of the assemblage as shown in FIG. 3. A plurality of shouldered conductor pins 30 are then inserted downwardly through others of the aligned openings 26 in the mounting members 24 which are arranged in parallel rows at opposite sides of the flat-pack leads 16 and which intersect the printed circuits 28 located on the outer surfaces of such members. Shoulders 32 on such pins define stop positions which limit their degree of insertion and assure uniformity of inserted positions of all such pins. At this time, all pins 30 have larger-diameter portions which project equally above the upper mounting board. Such pin-insertion has been illustrated in FIG. 3 as a manual technique, however, a machine (not shown) has been devised, for mechanizing the procedure.

Following this, the assemblage 10 is maintained positioned between the clamping members 29 with the projecting pins 30 extending upwardly to maintain their inserted positions by gravity, and the bottom of the assemblage, after coating with a soldered flux, is subjected to wave soldering (not shown) which electrically and mechanically joins the respective ends of the flat-pack leads 16 and the pins 30 to the respective printed circuit 28.

The clamped assemblage 10 is then turned over and placed in a tray containing a liquid solder-resist material of limited depth to coat only portions of the pins 30 projecting from the printed circuit face of the respective mounting member 24 beyond the ends of the flat-pack leads 16. The solder-resist is allowed to dry, a flux is applied to the pin-projecting face of the assemblage 10, as by spraying, and such face is then also subjected to wave soldering which includes immersion of the projecting ends of flat-pack leads 16, the respective printed circuit 28, and the projecting pins 30. The outer ends of the respective flat-pack leads 16 and portions of the projecting pins 30 immediately adjacent to the respective mounting member 24 thus become soldered at 34 to the printed circuit 28 on the outer face of such member 24. The solder flux is then removed, after which the solder-resist on the projecting ends of the pins 30 is removed, as by brush and air blast to leave such ends solderless.

After such completion of the soldering operation, the projecting uncoated portions of certain pins 30 which are to serve only for interconnection between the two printed circuits 28 will be cut off. Others to serve as input/output pins 30 are allowed to remain intact.

In completion of the assemblage 10, it is encapsulated in a potting compound 36, FIG. 1, such as mineral-filled epoxy, which embraces the entirety of the assemblage, including both printed circuits 28, except for projecting ends of the input/output pins 30.

In use of the assemblage, the input/output pins 30 thereof are plugged into accommodating holes affiliated, for example, with a printed circuit board (not shown) encompassing other such assemblages 10 and correlating same into a circuit system.

In the construction of the assemblage 10, the mounting members 24 may be made of an electrical insulating material capable of withstanding heat at molten solder temperature and of adherence by printed conductors thereon. A highly satisfactory material has been diallyl isophthalate, DAP, with its shape and the tapered-end pin-accepting holes 26 molded therein and the printed circuit 28 conductors applied to a face thereof by electrolysis copper deposition and copper plating. The DAP material withstands the molten solder temperature to which it is subjected during the wave soldering step and provides adherence properties sufficient to maintain the copper-printed circuit leads in place during such soldering. In practice, .008 inch wide printed leads and pads with .007 inch land spacing have been employed successfully.

Epoxy-glass members 24 with copper plated circuit leads 28 thereon, or alumina members 24 with screened-on circuit leads 28 also may be suitable substitutes for the DAP members 24. In lieu of molding the tapered-end pin-accommodating holes 26, such holes might be drilled, at some added expense and inconvenience over the molding technique.

We claim as our invention:

1. A method of making a plug-in assemblage of micro-circuit flat-pack modules, comprising the steps of, providing a pair of thin rectangular mounting members of electrical insulating material each having a flat outer face with a printed circuit thereon, a flat inner face, a plurality of parallel alternate rows of lead-accommodating and pin-accommodating holes having tapered ends at such inner face and extending through such members to the printed circuit on the outer face thereof, prearranging the required number of flat-pack modules in spaced-apart parallel array with their leads projecting in parallel rows at each side corresponding to distribution of the rows of lead-accommodating holes in the mounting members, by employment of an assembling fixture having open-end slots which accept sidewise movement of the flat-pack leads thereinto, inserting at each side of the pre-arranged flat-pack array all of the projecting leads on a given side simultaneously into and through the tapered ends of the leads-accommodating holes of a respective mounting member until such leads project beyond the printed circuit on the outer face of such member, by guided cooperation with the assembling fixture, removing the partial assemblage which includes mounting members and flat-pack modules from the assembling fixture while maintaining sufficient closeness of the two mounting members to prevent escape of the flat-pack leads from the lead-accommodating holes therein; and placing such partial assemblage in a horizontal attitude in which the printed circuit face of one mounting member faces upwardly, providing a plurality of alike shouldered pins each having a smaller-diameter longitudinal portion capable of insertion into the pin-accommodating holes in the mounting members and a larger-diameter longitudinal portion incapable of such insertion, which smaller-diameter portion is of length at least slightly greater than the distance between the printed circuits on the outer faces of the two mounting members of the partial assemblage, inserting the smaller-diameter portions of such pins downwardly into and through the pin-accommodating holes in the uppermost mounting member and thereby also through the corresponding holes in the lowermost mounting member, administering wave soldering to the bottom surface of the lowermost mounting member to electrically and mechanically join projecting ends of the shouldered pins and flat-pack module leads to the printed circuit thereon, coating the larger-diameter portions of the pins projecting from the printed circuit on the outer face of the other mounting member with a solder-resist to the exclusion of its length in the vicinity of such printed circuit, subjecting the pin-projecting printed circuit face of nearly-completed assemblage to wave soldering to obtain electrical connection of the larger-diameter pin portions and of flat-pack module lead ends to the respective printed circuit, removing the solder-resist on the projecting pin portions, and encapsulating the afore-resulting assemblage in a potting compound which embraces the two printed circuits and excludes propecting ends of the larger-diameter portions of the pins.

2. The method of claim 1, further including the step of removing a substantial portion, but less than all of the larger-diameter portions of certain ones of the pins, while in their inserted positions in the pin-accommodating holes of the two mounting members.

3. A method of making a plug-in assemblage of micro-circuit flat-pack modules, comprising the steps of, providing a pair of thin rectangular mounting members of electrical insulating material each having a flat outer face with a printed circuit thereon, a flat inner face, a plurality of parallel alternate rows of lead-accommodating and pin-accommodating holes having tapered ends at such inner face and extending through such members to the printed circuit on the outer face thereof, prearranging the required number of flat-pack modules in spaced-apart parallel array with their leads projecting in parallel rows at each side corresponding to distribution of the rows of lead-accommodating holes in the mounting members by employment of an assembling fixture having open-end slots which accept sidewise movement of the flat-pack leads thereinto, inserting at each side of the prearranged flat-pack array all of the projecting leads on a given side simultaneously into and through the tapered ends of the lead-accommodating holes of a respective mounting member until such leads project beyond the printed circuit on the outer face of such member, by guided cooperation with the assembling fixture, removing the partial assemblage which includes mounting members and flat-pack modules from the assembling fixture while maintaining sufficient closeness of the two mounting members to prevent escape of the flat-pack leads from the lead-accommodating holes therein; and placing such partial assemblage in a horizontal attitude in which the printed circuit face of one mounting member faces upwardly, providing a plurality of alike shouldering pins each having a smaller-diameter longitudinal portion capable of insertion into the pin-accommodating holes in the mounting members and a larger-diameter longitudinal portion incapable of such insertion, which smaller-diameter portion is of length at least slightly greater than the distance between the printed circuits on the outer faces of the two mounting members of the partial assemblage, inserting the smaller-diameter portions of such pins downwardly into and through the pin-accommodating holes in the uppermost mounting member and thereby also through the corresponding holes in the lowermost mounting member, soldering the shouldered pins and flat-pack module leads to the printed circuits on the outer surfaces of the mounting members to the exclusion of projecting ends of the larger-diameter portions of such pins, and, encapsulating the afore-resulting assemblage in a potting compound which embraces the two printed circuits and excludes such projecting ends of the larger-diameter portions of the pins.

References Cited

UNITED STATES PATENTS

| | | | |
|---|---|---|---|
| 3,151,277 | 9/1964 | Gray. | |
| 3,266,125 | 8/1966 | Tobolski | 29—155.5 |
| 3,323,023 | 5/1967 | Walker. | |
| 3,384,956 | 5/1968 | Flanders et al. | 29—624 |
| 3,404,215 | 10/1968 | Burks et al. | |
| 3,451,131 | 6/1969 | Gruenstein | 29—624 |

JOHN F. CAMPBELL, Primary Examiner

V. A. DIPALMA, Assistant Examiner

U.S. Cl. X.R.

29—626, 627; 174—68; 317—101